United States Patent [19]

Yamaguchi et al.

[11] Patent Number: 4,782,466
[45] Date of Patent: Nov. 1, 1988

[54] PROGRAMMABLE SEMICONDUCTOR READ ONLY MEMORY DEVICE

[75] Inventors: Satoru Yamaguchi, Nagoya; Kunihiko Wada, Kawasaki; Noriaki Sato, Machida, all of Japan

[73] Assignee: Fujitsu Limited, Kawasaki, Japan

[21] Appl. No.: 902,675

[22] Filed: Sep. 2, 1986

[30] Foreign Application Priority Data

Sep. 4, 1985 [JP] Japan .................... 60-195167
Nov. 29, 1985 [JP] Japan .................... 60-268547

[51] Int. Cl.$^4$ .................................... G11C 11/24
[52] U.S. Cl. ............................. 365/149; 365/230
[58] Field of Search ............ 365/102, 149, 189, 230

[56] References Cited

U.S. PATENT DOCUMENTS 4,272,832  6/1981  Ito ............................. 365/189
4,520,466  5/1985  Mashiko ....................... 365/210

Primary Examiner—James W. Moffitt
Attorney, Agent, or Firm—Staas & Halsey

[57] ABSTRACT

A programmable semiconductor read only memory device which includes a memory cell array formed by a plurality of memory cells arranged in a matrix arrangement. Each memory cell in the memory cell array includes a transistor having a gate thereof coupled to a word line, and a capacitor having an insulator layer, having a first terminal coupled to a bit line and having a second terminal coupled to the transistor so that the capacitor is grounded via the transistor. The insulator layer of the capacitor of a selected memory cell breaks down when a specific word line and a specific bit line coupled to the selected memory cell are driven, thereby making the capacitor conductive.

13 Claims, 7 Drawing Sheets

PROGRAMMABLE SEMICONDUCTOR READ ONLY MEMORY DEVICE

BACKGROUND OF THE INVENTION

The present invention generally relates to programmable semiconductor read only memory devices. More particularly, the present invention is directed to a programmable semiconductor read only memory device comprising a memory cell array formed by a plurality of memory cells arranged in a matrix arrangement wherein information is positively written into a selected memory cell and a breakdown of insulator layers of non-selected memory cells is prevented from occurring during a write operation.

In a conventional programmable semiconductor read only memory device, there is a programmable read only memory (hereinafter simply referred to as a PROM) of the type wherein information is written into a selected memory cell by melting a fuse of the selected memory cell. However, a breakdown of an insulator for a conduction type PROM (hereinafter simply referred to as a BIC PROM) comprising memory cells each formed by a metal insulator semiconductor field effect transistor (hereinafter simply referred to as a MIS FET) and a capacitor has been recently proposed. In such a BIC PROM, a word line is coupled to a gate of the MIS FET of the memory cell, and a bit line is grounded via the MIS FET and the capacitor of the memory cell. When writing information into a selected memory cell of the BIC PROM, a high voltage is applied to the capacitor of the selected memory cell so as to break down an insulator layer of the capacitor and make the capacitor conductive. According to the BIC PROM, a write operation can be performed within an extremely short time i.e., on the order of several microseconds, and for this reason, the BIC PROM is suited for use in various devices. On the other hand, during the write operation of the BIC PROM, it is necessary to protect the capacitors of non-selected memory cells so that the breakdown of the insulator layers of these capacitors will not occur.

However, when the memory cell array of the BIC PROM is simply controlled by a combination of high-level and low-level voltages, as in the case of a PROM in which the information is written into the memory cell by melting the fuse of the memory cell, there is a possiblity that the MIS FET and the capacitor of the non-selected memory cell may become damaged during the write operation. In addition, there are problems in that the circuit construction of the BIC PROM becomes complex when additional circuits and power sources are provided to protect the non-selected memory cells, and furthermore, the integration density of the BIC PROM becomes poor and the power consumption of the BIC PROM becomes large.

On the other hand, the voltage applied to the selected memory cell of the BIC PROM for breaking down the insulator layer of the capacitor is applied to the capacitor via the MIS FET. For this reason, it is impossible to apply a large voltage to the bit line, since the MIS FET of the selected memory cell will become damaged if the voltage applied to the selected memory cell is greater than a maximum tolerable voltage of the MIS FET. Hence, there is a problem in that a capacitor which must have a large voltage applied in order to break down the insulator layer thereof cannot be used in the BIC PROM. When considering the wide range of applications of the BIC PROM, it is desirable that the information can be written into the selected memory cell even when the capacitor of the selected memory cell requires a large voltage for breaking down the insulator layer thereof, and that the non-selected memory cells are positively protected.

SUMMARY OF THE INVENTION

Accordingly, it is a general object of the present invention to provide a novel and useful programmable semiconductor read only memory device in which the problems described heretofore are eliminated and desirable conditions are satisfied.

Another and more specific object of the present invention is to provide a programmable semiconductor read only memory device comprising a memory cell array formed by a plurality of memory cells arranged in a matrix arrangement. The plurality of memory cells are coupled to respective word lines and respective bit lines, and each memory cell in the memory cell array comprises a transistor having a gate thereof coupled to a word line, and a capacitor comprising an insulator layer and having one terminal thereof coupled to a bit line and the other end thereof coupled to the transistor so that the capacitor is grounded via the transistor. The insulator layer of the capacitor of only a selected memory cell breaks down thereby making the capacitor conductive when a specific word line and a specific bit line coupled to the selected memory cell are driven. According to the memory device of the present invention, information can be written into the selected memory cell by breaking down the insulator layer of the capacitor of the selected memory cell, and furthermore, it is possible to positively prevent insulator layers of capacitors of non-selected memory cells from breaking down. It is possible to protect the non-selected memory cells without the need to provide additional circuitry and power sources. In addition, it is possible to positively write the information into the selected memory cell even in the case where a large insulator breakdown voltage is required to break down the insulator layer of the capacitor of the selected memory cell.

Still another object of the present invention is to provide a programmable semiconductor read only memory device in which each memory cell comprises a semiconductor substrate, and first and second impurity regions formed in surface portions of the semiconductor substrate, a first insulator layer formed on the semiconductor substrate. The first insulator layer has first and second contact holes respectively formed over the first and second impurity regions. A gate layer is formed on the semiconductor substrate, a second insulator layer is formed over the first contact hole in the first insulator layer, a first wiring layer is formed over the second contact hole in the first insulator layer, and a second wiring layer formed over the second insulator layer. The first wiring layer is grounded, the second wiring layer is coupled to the bit line, the gate layer is coupled to the word line, and the second insulator layer forms the insulator layer of the capacitor.

A further object of the present invention is to provide a programmable semiconductor read only memory device in which the capacitor in all of the plurality of memory cells in the memory cell arrays is discharged in a first half of a write cycle and only the transistor of the selected memory cell is turned ON during a second half of the write cycle.

Another object of the present invention is to provide a programmable semiconductor read only memory device comprising an address register supplied with an address signal, a row decoder supplied with an output of the address register for designating a row address of the selected memory cell within the memory cell array by driving the specific word line coupled to the selected memory cell, a column decoder supplied with an output of the address register for designating a column address of the selected memory cell within the memory cell array by driving the specific bit line coupled to the selected memory cell, and a read/write circuit for supplying data to be written into the memory cell array and for receiving data read out from the memory cell array. The read/write circuit comprises a write circuit for controlling the column decoder, all of the word lines are driven in a first half of each write cycle, and the write circuit controls the column decoder so that none of the bit lines are driven in the first half of each write cycle and only the specific bit line coupled to the selected memory cell is driven during a second half of each write cycle.

Other objects and further features of the present invention will be apparent from the following detailed description when read in conjunction with the accompanying drawings.

DESCRIPTION OF THE PREFERRED EMBODIMENTS

Figure 1:
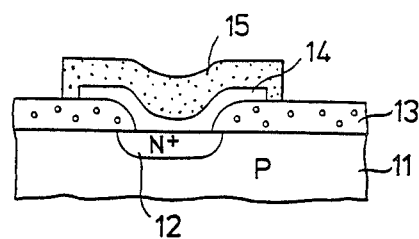
FIG. 1 is a cross-sectional view of a capacitor of a memory cell of a BIC PROM.

FIG. 1 is a cross section of a capacitor of a memory cell of a BIC PROM. The capacitor includes a p-type silicon substrate 11, an $n^+$-type impurity region 12 formed in a surface portion of the substrate 11, an insulator layer 13 formed on the substrate 11, an insulator layer 14 formed over a contact hole in the insulator layer 13, and an electrode wiring layer 15. For example, the insulator layer 13 is made of phospho-silicate-glass (PSG), and the electrode wiring layer 15 is made of aluminum (Al).

Figure 2:
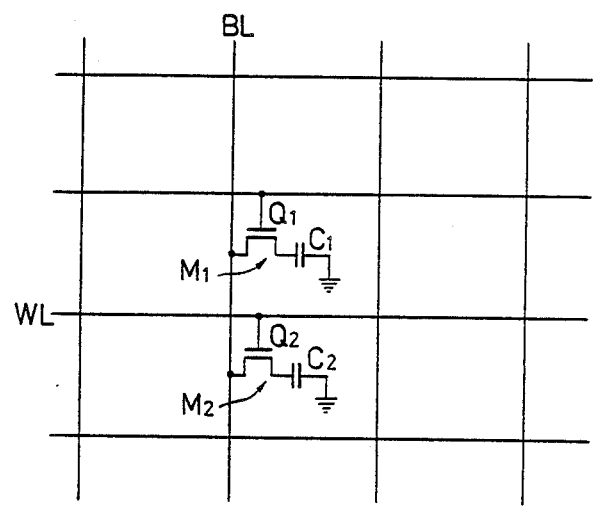
FIG. 2 is a circuit diagram of an equivalent circuit of memory cells of the BIC PROM.
Figure 3A:
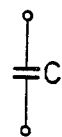
FIGS. 3A through 3C are equivalent circuit diagrams of a non-selected memory cell of the BIC PROM shown in FIG. 2 before a write operation, during the write operation and after the write operation, respectively.
Figure 3B:
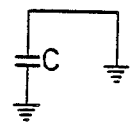
Figure 3C:
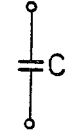
Figure 4A:
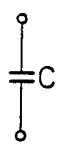
FIGS. 4A through 4C are equivalent circuit diagrams of a selected memory cell of the BIC PROM shown in FIG. 2 before the write operation, during the write operation and after the write operation, respectively.
Figure 4B:
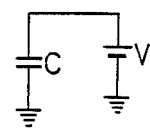
Figure 4C:

FIG. 2 is an equivalent circuit of the memory cells of the conceivable BIC PROM in FIG. 1. For convenience, only two memory cells are shown in FIG. 2, but a plurality of such memory cells are arranged in a matrix arrangement. A memory cell M1 comprises an N-channel metal oxide semiconductor (MOS) FET Q1 and a capacitor C1, and a memory cell M2 comprises an N-channel MOS FET Q2 and a capacitor C2. In order to write information into a memory cell, a large voltage is applied across the insulator layer 14 of the capacitor so that the insulation layer breaks down and becomes conductive. Information is written into a selected memory cell by applying voltages to a word line and a bit line coupled thereto so that the transistor turns ON and the voltage on the bit line is applied to the capacitor. No information is written into a non-selected memory cell by not applying a voltage to a word line coupled thereto so that the transistor is OFF and the voltage on the bit line is not applied to the capacitor. FIGS. 3A, 3B and 3C respectively show equivalent circuits of the non-selected memory cell before the write operation is performed, during the write operation and after the write operation. The memory cell is non-conductive when the insulator layer 14 of the capacitor thereof is not broken down. On the other hand, FIGS. 4A, 4B and 4C respectively show equivalent circuits of the selected memory cell before the write operation is performed, during the write operation and after the write operation. It may be seen that the memory cell is conductive when the insulator 14 breaks down. In this case, the memory cell has a resistance R as shown in FIG. 4C. In FIGS. 3A through 4C, the capacitance of the capacitor is denoted by C and the voltage applied to the capacitor is denoted by V.

When it is assumed that the non-conductive memory cell represents a data "0" and the conductive memory cell represents a data "1", the insulator layer 14 of the capacitor C1 of the memory cell M1 is broken down in the case where the data "1" is to be written into the memory cell M1. In other words, the memory cell having the capacitor with the broken down insulator layer represents the data "1" and the memory cell having the capacitor with the normal insulator layer represents the data "0". When such memory cells are arranged in a matrix arrangement, it is possible to form a memory cell array of the BIC PROM. The data can be read out from the memory cell by applying a voltage to the insulator layer of the capacitor and amplifying a voltage which is read out of the memory cell. Current flows through the memory cell when the memory cell stores the data "1", but no current flows through the memory cell when the memory cell stores the data "0".

When performing the write operation with the memory cell array formed by the memory cells shown in FIG. 2, the insulating layer of the capacitor of the selected memory cell is broken down by applying a voltage, having a level sufficient for breaking down the insulating layer, to the capacitor of the selected memory cell. The voltage applied to the memory cells is usually turned ON and OFF, so that the voltage is applied to only the capacitor of the selected memory cell and the voltage is not applied to the capacitor of the non-selected memory cells.

In each of the memory cells shown in FIG. 2, a word line WL is coupled to a gate of the MOS FET and a bit line BL is grounded via the MOS FET and the capacitor. Hence, when a word line WL is selected by applying a voltage to the word line WL, for example, the MOS FET Q2 of the memory cell M2 is turned ON. Then, when a write-in pulse voltage V is applied to a bit line BL, the write-in pulse voltage is applied to the capacitor C2 of the memory cell M2 and the insulator layer of the capacitor C2 is broken down. As a result, the capacitor C2 becomes conductive as shown in FIG. 4C and the data "1" is written into the memory cell M2. On the other hand, the MOS FET Q1 coupled to the bit line BL remains OFF because a word line coupled thereto is not selected. In other words, no voltage is applied to the word line which is coupled to the MOS FET Q1 of the memory cell M1, and the write-in pulse voltage will not be applied to the capacitor C1 of the memory cell M1. Therefore, the capacitor C1 remains non-conductive as shown in FIG. 3C.

However, according to the memory cells shown in FIG. 2, the write-in pulse voltage for breaking down the insulating layer of the capacitor of the selected memory cell is applied to the capacitor via the MOS FET. When $V_G$ is applied to the gate of the MOSFET and a large voltage is applied to the bit line, a voltage level of a node between the MOSFET and the capacitor is $V_G - V_{th}$ because of the characteristic of the MOSFET. For this reason, an effective bias voltage applied to the insulator layer of the capacitor of the memory cell is as large as $V_G - V_{th}$ even when the write-in pulse voltage is larger than $V_G - V_{th}$, where $V_G$ is the word line voltage and $V_{th}$ is the threshold voltage of the MOS FET of the memory cell. Therefore, the voltage $V_G - V_{th}$ must be larger than the breakdown voltage of the insulator layer of the capacitor of the memory cell. This means the voltage $V_G$ must be large enough because $V_{th}$ is constant. On the other hand, the MOS FET of the memory cell will become damaged if such a large word line voltage is applied to the gate electrode.

Figure 5:
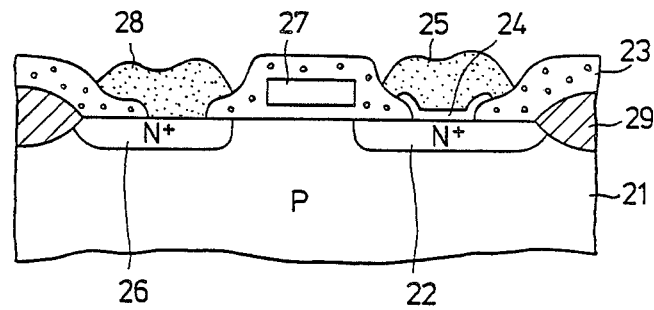
FIG. 5 is a cross-sectional view of a memory cell of an embodiment of the BIC PROM according to the present invention.

FIG. 5 is a cross section of a memory cell of an embodiment of a BIC PROM according to the present invention. The memory cell comprises a p-type silicon substrate 21, an n+-type impurity region 22 formed in a surface portion of the substrate 21, an insulator layer 23 formed on the substrate 21, an insulator layer 24 formed over a contact hole in the insulator layer 23, an electrode wiring layer 25, an n+-type source region 26 formed in the surface portion of the substrate 21, a gate layer 27, an electrode wiring layer 28 formed over a contact hole in the insulator layer 23, and a field oxide layer 29 for isolation. For example, the insulator layer 23 is made of phospho-silicate-glass (PSG), the electrode wiring layers 25 and 28 are made of aluminum (Al), and the gate layer 27 is made of polysilicon. The gate layer 27 is coupled to the word line, the electrode wiring layer 25 is coupled to the bit line, and the electrode wiring layer 28 is grounded. The insulator layer 24 can have a thickness of 50 Å to 200 Å. According to the present embodiment, the insulator layer 24 covers a contact area which is formed on the PSG layer (insulator layer 23) to connect the drain diffusion region. Hence, the memory cell can be formed on the substrate 21 at a latter part of the production process. As a result, other elements and devices such as an erasable PROM (EPROM) can easily be provided on the same substrate as the memory cell.

Figure 6:
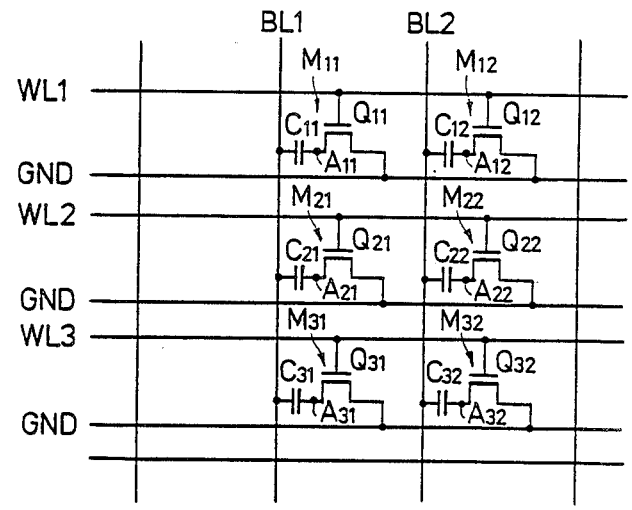
FIG. 6 is a circuit diagram of a BIC PROM according to the present invention.

FIG. 6 shows the equivalent circuit of the memory cells of the BIC PROM according to the present invention. For convenience, only six memory cells are shown in FIG. 6. A memory cell M11 comprises an N-channel MOS FET Q11 and a capacitor C11, a memory cell M12 comprises an N-channel MOS FET Q12 and a capacitor C12. Similarly, memory cells M21, M22, M31 and M32 comprise respective N-channel MOS FETs Q21, Q22, Q31 and Q32 and respective capacitors C21, C22, C31 and C32.

When performing a write operation so as to write information into the selected memory cell M11, a voltage is applied to a word line WL1 so as to turn ON the MOS FET Q11. Then, a write-in pulse voltage is applied to a bit line BL1. Unlike in the memory cells shown in FIG. 2, the write-in pulse voltage from the bit line BL1 is applied directly to the capacitor C11 of the memory cell M11. As a result, the insulator layer of the capacitor C11 is broken down, and the memory cell M11 becomes conductive.

On the other hand, no voltage is applied to word lines WL2 and WL3. Hence, even when the write-in pulse voltage is applied to the bit line BL1, the MOS FETs Q21 and Q31 of the non-selected memory cells M21 and M31 remain OFF, and no current flows between the source and drain of the respective MOS FETs Q21 and Q31. The write-in pulse voltage from the bit line BL1 is applied to the drains of the MOS FETs Q21 and Q31, and the MOS FETs Q21 and Q31 are reverse biased. As a result, a depletion layer is formed in the drain diffusion region of the respective MOS FETs Q21 and Q31. This depletion layer may be considered as a capacitance, and the non-selected memory cells M21 and M31 each become equivalent to a series connection of the capacitance of the insulator layer of the capacitor and the capacitance of the depletion layer.

Figure 7A:
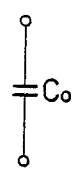
FIGS. 7A through 7C are equivalent circuit diagrams of a non-selected memory cell of the BIC PROM shown in FIG. 6 before the write operation, during the write operation and after the write operation, respectively.
Figure 7B:
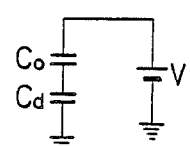
Figure 7C:
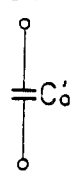

FIGS. 7A through 7C are equivalent circuit diagrams of the non-selected memory cell of the BIC PROM shown in FIG. 6 before the write operation, during the write operation and after the write operation, respectively. As may be seen from FIGS. 7A through 7C, when a voltage greater than an insulator breakdown voltage required to break down the insulator layer is applied to the capacitor C21 of the non-selected memory cell M21, for example, this voltage is divided between the capacitor C21 (that is, the capacitance $C_0$ of the insulator layer) and the capacitance $C_d$ of the depletion layer. Accordingly, the voltage which is actually applied to the insulator layer of the capacitor C21 becomes less than the insulator breakdown voltage, and the breakdown of the insulator layer of the capacitor C21 will not occur. Hence, the non-selected memory cell after the write operation has a capacitance $C_0'$ shown in FIG. 7C which is equal to a capacitance of the series-connected capacitances $C_0$ and $C_d$.

Figure 8A:
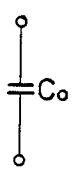
FIGS. 8A through 8C are equivalent circuit diagrams of a selected memory cell of the BIC PROM shown in FIG. 6 before the write operation, during the write operation and after the write operation, respectively.
Figure 8B:
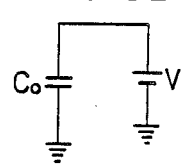
Figure 8C:
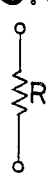

FIGS. 8A through 8C are equivalent circuit diagrams of the selected memory cell of the BIC PROM shown in FIG. 6 before the write operation, during the write operation and after the write operation, respectively. As may be seen from FIGS. 8A through 8C, when the insulator breakdown voltage is applied to the capacitor C11 of the selected memory cell M11, the insulator layer of this capacitor C11 will break down.

Therefore, according to the present embodiment, the insulator layer of the non-selected memory cell will not break down even when applied with the voltage greater than the insulator breakdown voltage, and only the insulator layer of the selected memory cell is broken down. For this reason, it is possible to selectively write the information to the selected memory cell even when the insulator layers of the memory cells in the BIC PROM have a large insulator breakdown voltage.

Figure 9:
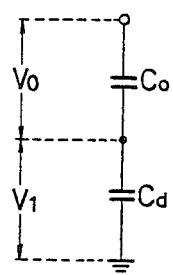
FIG. 9 show capacitances of an insulator layer and a depletion layer of the non-selected memory cell of the BIC PROM shown in FIG. 6.

FIG. 9 shows the capacitances of the insulator layer and the depletion layer of the non-selected memory cell. The insulator layer of the capacitor of the memory cell has the capacitance $C_0$, and the depletion layer has the capacitance $C_d$.

The following equation (1) applies when a voltage $V_0$ is applied to the insulator layer of the memory cell and a voltage $V_1$ is applied to the drain region of the MOS FET of this memory cell, where $S_1$ denotes the area of the depletion layer, $S_0$ denotes the area of the insulator layer of the capacitor and the value 0.01 is a numerical value calculated from the relative dielectric constant and the like of the insulator layer.

$$V_0/V_1 = C_d/C_0 = 0.01 \times S_1/S_0 \quad (1)$$

It may be understood from equation (1) that the voltage $V_0$ is approximately 1/100 the voltage $V_1$ because $S_1$ and $S_0$ are approximately equal to each other. This means that only a slight voltage, that is, a virtually negligible small voltage, is applied to the insulator layer of the capacitor and the breakdown of the insulator layer consequently does not occur. In other words, the information is positively written into only the selected memory cell and the information is positively prevented from being written into the non-selected memory cells.

Figures 10A, 10B, 10C:
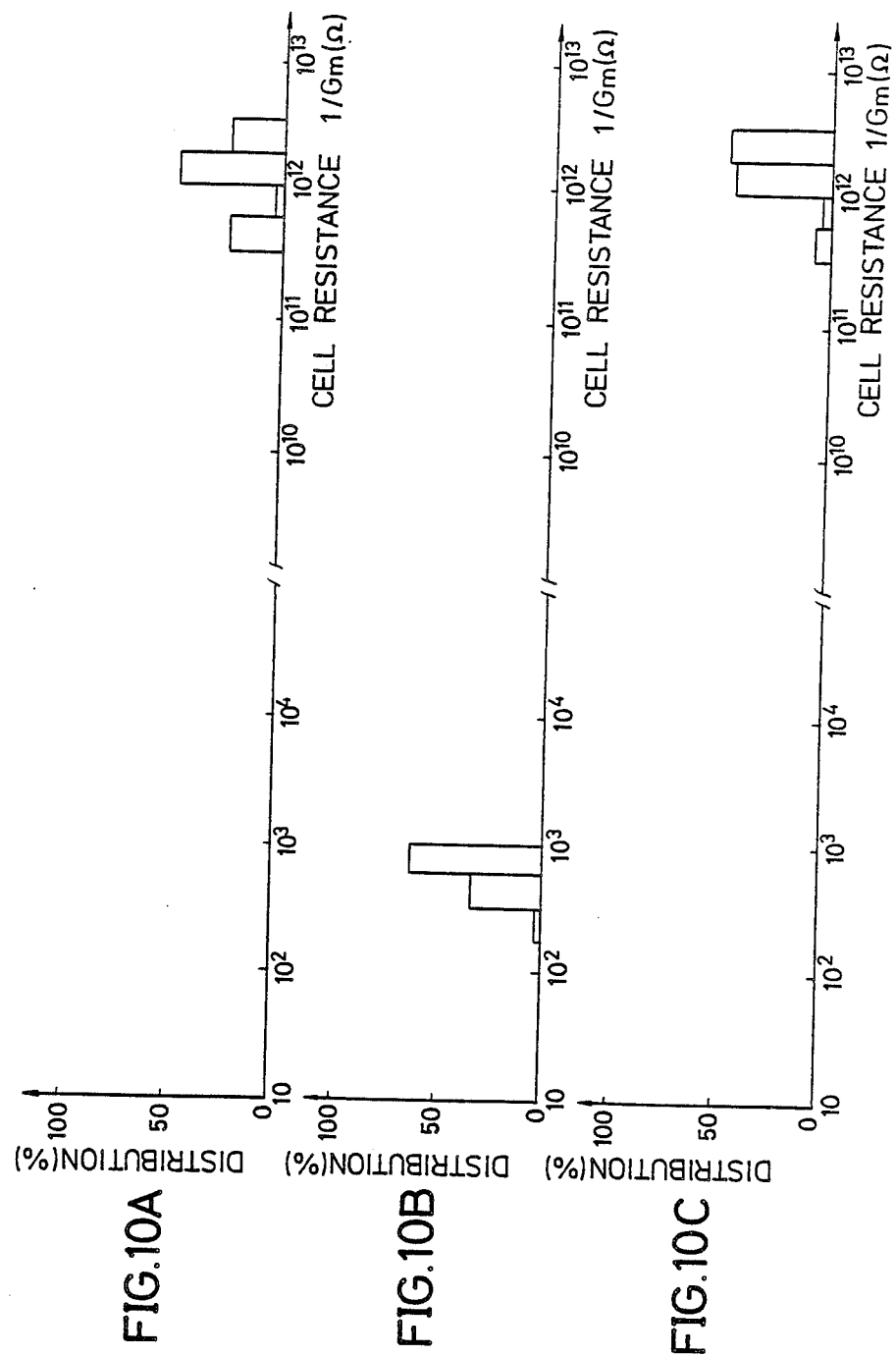
FIGS. 10A through 10C respectively are memory cell resistance distributions of the BIC PROM according to the present invention.

Measured results of the memory cell resistance distribution of the BIC PROM according to the present invention before and after the write operation is performed are shown in FIGS. 10A through 10C. FIG. 10A is a graph of the memory cell resistance distribution of the pre-programmed memory cells, FIG. 10B is a graph of the memory cell resistance distribution of the selected memory cells after the write operation, and FIG. 10C is a graph of the memory cell resistance distribution of the non-selected memory cells after the write operation. In FIGS. 10A through 10C, the abscissa represents the memory cell resistance in 1/Gm ($\Omega$) and the ordinate represents the percentage (%) of the memory cells. It may be seen from FIG. 10B that the insulator layer of the capacitor of each selected memory cell is broken down after the write operation and that the resistance of the insulator layer has become low. In addition, it may be seen from FIG. 10C that the insulator layer of the capacitor of each non-selected memory cell is not broken down and that the resistance of the insulator layer is high as in FIG. 10A.

In the description given heretofore, it is assumed that the substrate is grounded. It is not, however, essential to ground the substrate, and the substrate may be biased by a constant voltage (for example, $-2.5$ V). In this case, a constant voltage is always applied to the insulator layer of the capacitor of the memory cell, however, the insulator layer will not break down with a sufficiently low substrate voltage. The insulator layer of the capacitor of the non-selected memory cell is prevented from breaking down by the series connection of the capacitances shown in FIG. 9. Therefore, it is also possible in this case to satisfactorily write information into the selected memory cell without breaking down the insulator layers of the non-selected memory cells.

Figure 11:
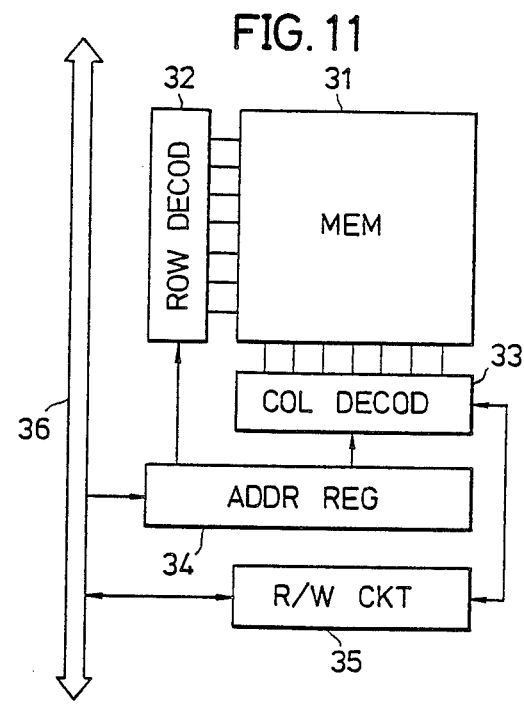
FIG. 11 is a system block diagram of an embodiment of the circuit construction of the BIC PROM according to the present invention.

FIG. 11 is an embodiment of the circuit construction of the BIC PROM according to the present invention. The BIC PROM generally comprises a memory cell array 31, a row decoder 32, a column decoder 33, an address register 34 and a read/write circuit 35. The memory cell array 31 comprises the memory cells shown in FIG. 6 arranged in a matrix arrangement, and is, for example, an 8-kbyte memory cell array. The row decoder 32, the column decoder 33, the address register 34 and the read/write circuit 35 form a peripheral circuit of the memory cell array 31.

For example, when a 13-bit address signal comprising bits $A_0$ through $A_{12}$ is supplied to the address register 34 via a data bus 36, the bits $A_0$ through $A_4$, $A_{11}$ and $A_{12}$ are supplied to the row decoder 32 while the bits $A_5$ through $A_{10}$ are supplied to the column decoder 32. Hence, a selected memory cell in the memory cell array 31 is designated by an output row address of the row decoder 32 and an output column address of the column decoder 33. During a write operation, a data to be written into the memory cell array 31 is supplied to the read/write circuit 35 via the data bus 36, and an output data of the read/write circuit 35 is supplied to the memory cell array 31 and is written into the selected memory cell. On the other hand, during a read operation, a data is read out from the selected memory cell in the memory cell array 31 and is supplied to the data bus 36 via the read/write circuit 35.

Figure 12:
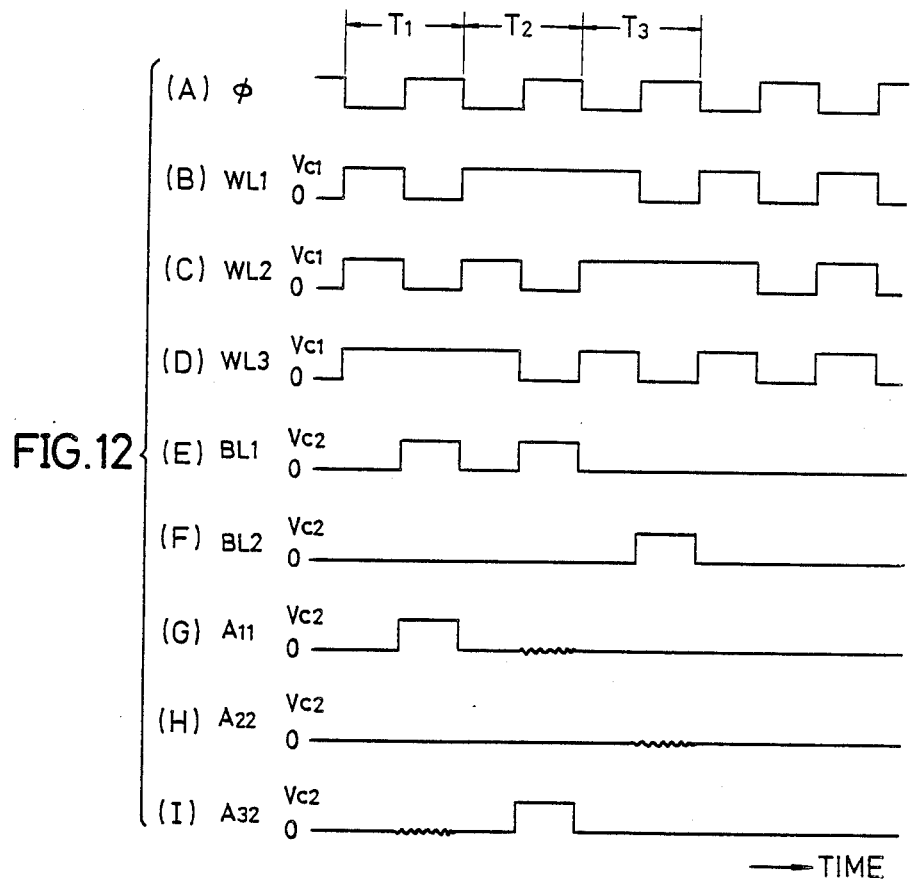
FIGS. 12(A) through 12(I) are timing charts for explaining the operation of the BIC PROM shown in FIG. 11.

An explanation will now be provided with respect to the write operation by referring to the time charts shown in FIGS. 12(A) through 12(I). For convenience it will be assumed that the memory cell array 31 comprises a 2×3 matrix arrangement of memory cells M11 through M32 as shown in FIG. 6, and that the information is to be written into the selected memory cells M31, M11 and M22 in this sequence. FIG. 12(A) is a timing diagram of a clock signal $\phi$ having a period equal to the write cycle.

An initializing operation is performed by applying a voltage Vc1 to each of the word lines WL1 through WL3 during a first half of each of write cycles T1, T2, T3 and the like as shown in FIGS. 12(B) through 12(D) so that each of the nodes A11 through A32 are grounded. In other words, the word lines WL1 through WL3 are high and the nodes A11 through A32 are low during the first half of each write cycle. In addition, each of the bit lines BL1 and BL2 are low during the first half of each write cycle as shown in FIGS. 12(E) and 12(F).

After the initializing operation is performed, a memory cell is selected by applying the voltage Vc1 to the word line and applying a voltage Vc2 to the bit line which are coupled to the selected memory cell during a second half of the write cycle. In other words, the word line and the bit line coupled to the selected memory cell are made high during the second half of each write cycle. For example, the voltage Vc1 is +5 V and the voltage Vc2 is +24 V. When the memory cell M31 is the selected memory cell, the word line WL3 is high and the bit line BL1 is high during the second half of the write cycle T1 as shown in FIGS. 12(D) and 12(E), and the insulator layer of the capacitor C31 of the memory cell M31 is broken down as shown in FIG. 12(I). The non-selected memory cell M11 is also coupled to the bit line BL1 which is high during the second half of the write cycle T1, but since the word line WL1 coupled thereto remains low during the second half of the write cycle T1 as shown in FIG. 12(B), the node A11 is in a floating state. Thus, due to the capcaitive coupling described before, the node A11 only rises to a voltage near the voltage Vc2 as shown in FIG. 12(G), and a potential difference that would break down the insulator layer of the capacitor C11 of the memory cell M11 will not occur across the capacitor C11. Therefore, the insulator layer of the capacitor C11 of the memory cell M11 will not break down. The insulator layer of the capacitor C21 of the other non-selected memory cell M21 will also not break down for similar reasons.

Similarly, when selecting the memory cell M11, the word line WL1 and the bit line BL1 are made high during the second half of the write cycle T2 as shown in FIGS. 12(B) and 12(D), and the insulator layer of the capacitor C11 of the selected memory cell M11 is broken down during the second half of the write cycle T2 as shown in FIG. 12(G). Since the word line WL3 remains low during the second half of the write cycle T2, the insulator layer of the capacitor C31 of the non-selected memory cell M31 will not break down during the second half of the write cycle T2 as shown in FIG. 12(I). Furthermore, when selecting the memory cell M22, the word line WL2 and the bit line BL2 are made high during the second half of the write cycle T3 as shown in FIGS. 12(C) and 12(F), and the insulator layer of the capacitor C22 of the selected memory cell M22 is broken down during the second half of the write cycle T3.

Figure 13:
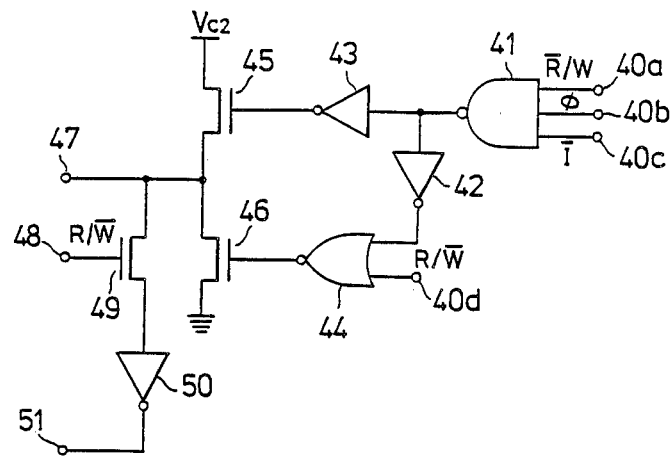
FIG. 13 is a system circuit diagram of an embodiment of a write circuit within a read/write circuit shown in FIG. 11.

FIG. 13 shows an embodiment of a write circuit within the read/write circuit 35 shown in FIG. 11. The write circuit comprises a 3-input NAND circuit 41, inverters 42 and 43, a 2-input NOR circuit 44, and N-channel transistors 45 and 46. A read/write control signal $\overline{R/W}$, the clock signal $\phi$ and a write-in data $\overline{I}$ are respectively applied to input terminals 40a, 40b and 40c and are supplied to the NAND circuit 41. An output signal of the NAND circuit 41 is supplied to one input terminal of the NOR circuit 44 via the inverter 42, and is supplied to the transistor 45 via the inverter 43. A read/write control signal R/$\overline{W}$ is applied to an input terminal 40d and is supplied to the other input terminal of the NOR circuit 44. An output signal of the NOR circuit 44 is supplied to the transistor 46. An output signal obtained from a connection point of the transistors 45 and 46 is output via an output terminal 47 and is supplied to the column decoder 33 shown in FIG. 11.

When performing the write operation, the read/write control signal $\overline{RW}$ is made high and the read/write control signal R/$\overline{W}$ is made low. Hence, when the clock signal $\phi$ is high, the logic level of the write-in data $\overline{I}$ is output via the output terminal 47 in phase with the clock signal $\phi$.

When performing a read operation, the read/write control signal $\overline{RW}$ is made low and the read/write control signal R/$\overline{W}$ is made high. The high-level read/write control signal R/$\overline{W}$ is also applied to a terminal 48. As a result, an N-channel transistor 49 coupled to the output terminal 47 is turned ON during the read operation, and the read out data from the column decoder 33 is supplied to the data bus 36 via an inverter 50 and a terminal 51.

Figure 14:
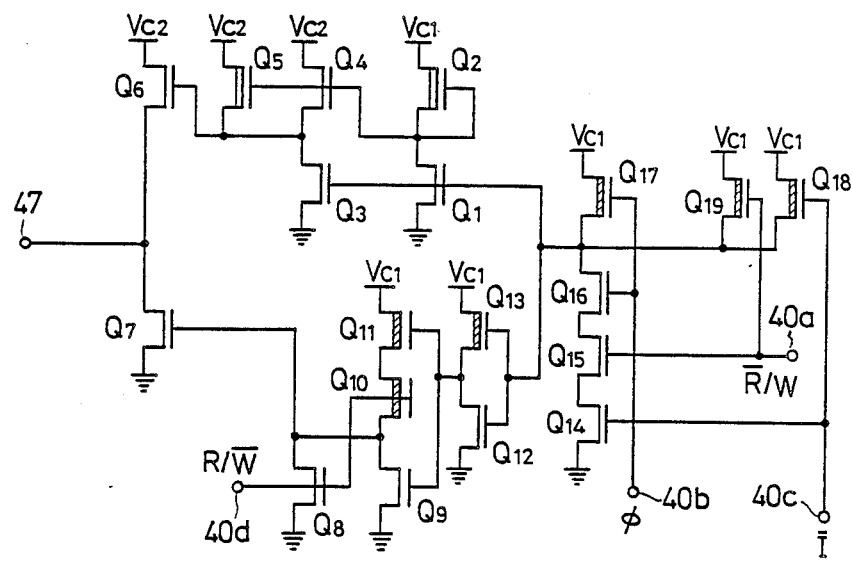
FIG. 14 is a circuit diagram of an embodiment of the concrete circuit construction of the write circuit shown in FIG. 13.

FIG. 14 is an embodiment of the write circuit shown in FIG. 13. In FIG. 14, the write circuit comprises N-channel depletion type transistors Q2 and Q5, P-channel enhancement type transistors Q10, Q11, Q13 and Q17 through Q19, and N-channel enhancement type transistors Q1, Q3, Q4, Q6 through Q9, Q12 and Q14 through Q16. The transistors Q3 through Q7 have a high withstand voltage. For example, the voltages Vc1 and Vc2 respectively are +5 V and +25 V.

When performing the write operation, the transistor Q15 is turned ON, the transistor Q19 is turned OFF, the transistor Q8 is turned OFF and the transistor Q10 is turned ON because the read/write control signal $\overline{R/W}$ is high and the read/write control signal R/$\overline{W}$ is low. Hence, when the clock signal $\phi$ is high, the logic level of the write-in data $\overline{I}$ is output via the output terminal 47 in phase with the clock signal $\phi$. When the write-in data $\overline{I}$ is low ("0"), the transistor Q7 is turned ON and the transistor Q6 is turned OFF, and in this case, a low-level signal (ground level) is output via the output terminal 47. On the other hand, when the write-in data $\overline{I}$ is high ("1"), the transistor Q7 is turned OFF and the transistor Q6 is turned ON, and in this case, a high-level signal (Vc2) is output via the output terminal 47. When the clock signal $\phi$ is low, the the transistor Q7 is turned ON and the transistor Q6 is turned OFF, a low-level signal (ground level) is output via the output terminal 47. The insulator layer of the capacitor of the selected memory cell having the MOS FET thereof turned ON breaks down when the high-level signal is output via the output terminal 47.

When performing the read operation, the read/write control signal $\overline{R/W}$ is made low and the read/write control signal R/$\overline{W}$ is made high. Hence, the transistor Q15 is turned OFF, the transistor Q19 is turned ON, the transistor Q8 is turned ON and the transistor Q10 is turned OFF. Since the transistors Q6 and Q7 are turned OFF in this case, the impedance of a signal line from the output terminal 47 to the column decoder 33 shown in FIG. 11 becomes high. Therefore, it is possible to read out the data from the selected memory cell by use of a read circuit (not shown) which is coupled to the signal line.

Figure 15:
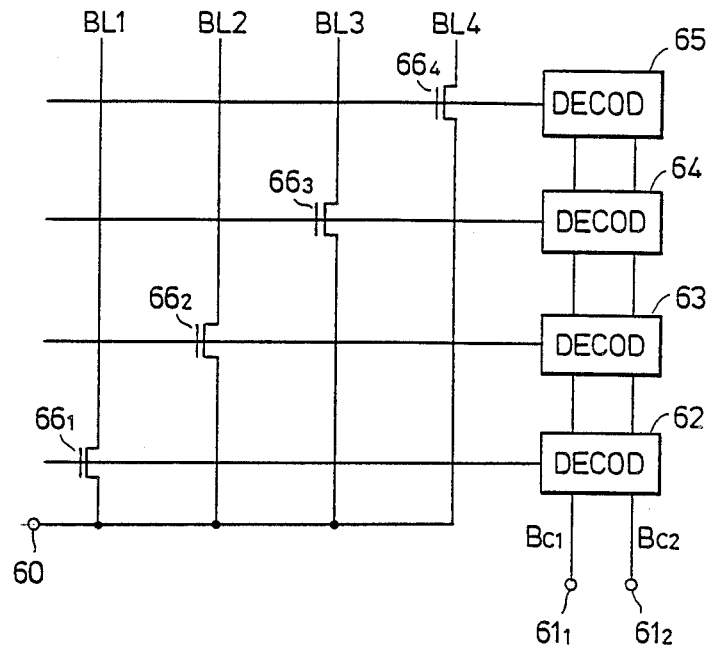
FIG. 15 is a circuit diagram of an embodiment of a column decoder shown in FIG. 11.

FIG. 15 is an embodiment of the column decoder 33 shown in FIG. 11. For convenience, it will be assumed that the column address comprises two bits. In the case where the column address comprises bits $B_{C1}$ and $B_{C2}$, one of four bit lines BL1 through BL4 can be selected. The signal from the output terminal 47 shown in FIGS. 13 and 14 is supplied to a terminal 60. On the other hand, the column address bits $B_{C1}$ and $B_{C2}$ from the address register 34 shown in FIG. 11 are applied to terminals $61_1$ and $61_2$. The bits $B_{C1}$ and $B_{C2}$ are supplied to decoders 62 through 65. Output signals of the decoders 62 through 65 turn ON N-channel transistors $66_1$ through $66_4$ coupled to the respective bit lines BL1 through BL4. Hence, when the bits $B_{C1}$ and $B_{C2}$ designate the bit line BL1, for example, the transistor $66_1$ of the bit line BL1 is turned ON by the output signal of the decoder 62, and the signal from the terminal 60 is applied to the bit line BL1.

Figure 16:
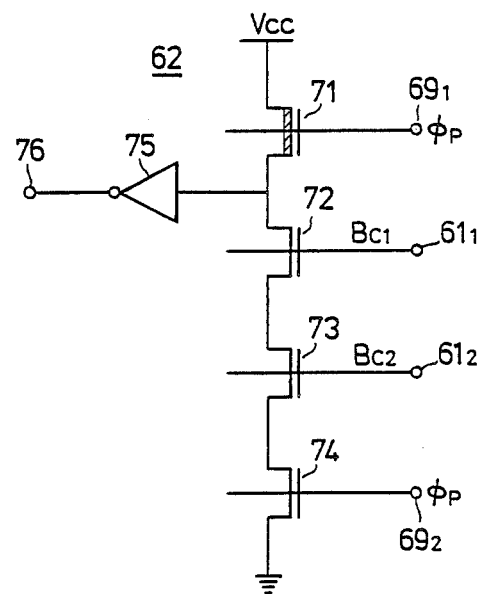
FIG. 16 is a circuit diagram of an embodiment of a decoder shown in FIG. 15.

FIG. 16 is an embodiment of the decoder 62 shown in FIG. 15. Since the decoders 63 through 65 are constructed similarly to the decoder 62, an explanation will only be given with respect to the decoder 62. The decoder 62 comprises a P-channel transistor 71, N-channel transistors 72 through 74, and an inverter 75. A clock signal $\phi_p$ in phase synchronism with the clock signal $\phi$ is applied to terminals $69_1$ and $69_2$. An output signal of the decoder 62 is obtained via the inverter 75 and a terminal 76 and is supplied to the transistor $66_1$ of the bit line BL1 shown in FIG. 15.

In the embodiments described heretofore, each memory cell is formed by a capacitor and a MOS FET, but it is possible to use a metal insulator semiconductor (MIS) FET instead of the MOS FET.

In a redundancy circuit, a circuit which is to be used is switched from a first circuit to a second circuit when the first circuit is defective. The memory cell described heretofore may be used as a switching element or device for carrying out the switching from the first circuit to the second circuit, by breaking down the insulator layer of the capacitor of the memory cell.

Further, the present invention is not limited to these embodiments, but various variations and modifications may be made without departing from the scope of the present invention.

What is claimed is:

1. A programmable semiconductor read only memory device comprising:
   a memory cell array including:
      a plurality of word lines;
      a plurality of bit lines intersecting said word lines; and
      a plurality of memory cells arranged in a matrix arrangement, said plurality of memory cells being respectively coupled at said intersections of said word lines and bit lines, each of said plurality of memory cells in said memory cell array comprising:
         a transistor having a gate coupled to a respective one of said word lines, a source, and a drain, one of said source and drain coupled to ground;
         a capacitor including an insulator layer and having a first terminal coupled to a respective one of said bit lines and having a second terminal coupled to said one of said source and drain of said transistor coupled to ground, said bit lines being selectively driven to a first predetermined voltage greater than ground and said word lines being selectively driven to a second predetermined voltage for turning on said transistor;
         said insulator layer of said capacitor of a selected one of said memory cells breaking down thereby making said capacitor conductive when a specific one of said word lines and a specific one of said bit lines coupled to said one of said selected memory cells are driven to the first and second predetermined voltages, respectively.

2. A programmable semiconductor read only memory device as claimed in claim 1, wherein said transistor of each of said memory cells is a metal insulator semiconductor field effect transistor.

3. A programmable semiconductor read only memory device as claimed in claim 2, wherein said transistor in each of said memory cells is an N-channel metal insulator semiconductor field effect transistor, said N-channel metal insulator semiconductor field effect transistor having a drain coupled to said second terminal of said capacitor and having a source coupled to ground.

4. A programmable semiconductor read only memory device as claimed in claim 1, wherein each one of said memory cells comprises:
   a semiconductor substrate;
   first and second impurity regions formed in surface portions of said semiconductor substrate;
   a first insulator layer formed on said semiconductor substrate, said first insulator layer having first and second contact holes respectively formed over said first and second impurity regions;
   a gate layer formed on said semiconductor substrate between said first and second impurity regions and contacting said first and second impurity regions;
   a second insulator layer formed in said first contact hole and extending onto said first insulator layer;
   a first wiring layer formed in said second contact hole and extending onto said first insulator layer; and
   a second wiring layer formed over said second insulator layer, said first wiring layer being grounded, said second wiring layer being coupled to one of said bit lines, said gate layer being coupled to one of said word lines, and said second insulator layer forming said insulator layer of said capacitor.

5. A programmable semiconductor read only memory device as claimed in claim 4, wherein said semiconductor substrate is made of p-type silicon, said first impurity region is an $n^+$-type impurity region including the drain of said transistor, and said second impurity region is an $n^+$-type impurity region including the source of said transistor.

6. A programmable semiconductor read only memory device as claimed in claim 4, wherein said first impurity region in said transistor of a non-selected memory cell is reverse biased thereby forming a depletion layer, said depletion layer having a capacitance smaller than a capacitance of said second insulator layer.

7. A programmable semiconductor read-only memory device as claimed in claim 4, wherein said semiconductor substrate is made of p-type silicon, said first impurity region is an $n^+$-type impurity region including the drain of said transistor, and said second impurity region is an $n^+$-type impurity region including the source of said transistor.

8. A programmable semiconductor read only memory device as claimed in claim 1, wherein said specific one of said word lines coupled to said selected memory cell is driven so that said transistor of said selected memory cell is turned ON, and wherein said ones of said word lines coupled to non-selected memory cells are not driven so that transistors of said non-selected memory cells are turned OFF.

9. A programmable semiconductor read only memory device as claimed in claim 1, wherein said capacitor in each of said plurality of memory cells in said memory cell array is discharged during a first half of a write cycle and only said transistor of said selected memory cell is turned ON during a second half of said write cycle.

10. A programmable semiconductor read only memory device as claimed in claim 9, further comprising:
    an address register connected to receive an address signal;
    a row decoder, coupled to said address register, for receiving said address signal from said address register and for designating a row address of said selected memory cell within said memory cell array by driving said specific one of said word lines coupled to said selected memory cell;

a column decoder, coupled to said address register, for receiving said address signal from said address register and for designating a column address of said selected memory cell within said memory cell array by driving said specific one of said bit lines coupled to said selected memory cell; and a read/write circuit, coupled to said column decoder, for supplying data to be written into said memory cell array and for receiving data read out from said memory cell array, said read/write circuit including:

a write circuit, coupled to said column decoder, for controlling said column decoder, all of said word lines being driven during a first half of each write cycle, said write circuit controlling said column decoder so that none of said bit lines are driven during the first half of each write cycle and only said specific one of said bit lines coupled to said selected memory cell is driven during a second half of each write cycle.

11. A programmable semiconductor read only memory device comprising:

a memory cell array including:
a plurality of word lines;
a plurality of bit lines intersecting said word lines; and
a plurality of memory cells arranged in a matrix, said plurality of memory cells being respectively coupled at said intersections of said word lines and bit lines, each of said plurality of memory cells in said memory cell array comprising:
a transistor having a gate coupled to a respective one of said word lines; and
a capacitor including an insulator layer and having a first terminal coupled to a respective one of said bit lines and having a second terminal coupled to said transistor and being connected to ground through said transistor, said transistor and capacitor in each one of said memory cells, including:
a semiconductor substrate;
first and second impurity regions formed in surface portions of said semiconductor substrate;
a first insulator layer formed on said semiconductor substrate, said first insulator layer having first and second contact holes respectively formed over said first and second impurity regions;
a gate layer formed on said semiconductor substrate between said first and second impurity regions and contacting said first and second impurity regions;
a second insulator layer formed in said first contact hole and extending onto said first insulator layer;
a first wiring layer formed in said second contact hole and extending onto said first insulator layer; and
a second wiring layer formed over said second insulator layer, said first wiring layer being grounded, said second wiring layer being coupled to one of said bit lines, said gate layer being coupled to one of said word lines, and said second insulator layer forming said insulator layer of said capacitor, said second insulator layer breaking down and making said capacitor conductive when a specific one of said word lines and a specific one of said bit lines coupled to said one of said selected memory cells are driven.

12. A programmable semiconductor read-only memory device as claimed in claim 11, wherein said first impurity region in said transistor of a non-selected memory cell is reversed bias thereby forming a depletion layer, said depletion layer having a capacitance smaller than a capacitance of said second insulator layer.

13. A programmable semiconductor read-only memory device comprising:

a memory cell array including:
a plurality of word lines;
a plurality of bit lines intersecting said word lines; and
a plurality of memory cells arranged in a matrix arrangement, said plurality of memory cells being respectively coupled at said intersections of said word lines and bit lines, each of said plurality of memory cells in said memory cell array comprising:
a transistor having a gate coupled to a respective one of said word lines;
a capacitor including an insulator layer and having a first terminal coupled to a respective one of said bit lines and having a second terminal coupled to said transistor so that the capacitor is grounded, said insulator layer of said capacitor of a selected one of said memory cells breaking down, thereby making said capacitor conductive when a specific one of said word lines and a specific one of bit lines coupled to said one of said selected memory cells are driven, said capacitor in each of said plurality of memory cells in said memory cell array being discharged during a first half of a write cycle and only said transistor of said selected memory cell being turned on during a second half of said write cycle;

an address register connected to receive an address signal;

a row decoder, coupled to said address register, for receiving said address signal from said address register and for designating a row address of said selected memory cell within said memory cell array by driving said specific one of said word lines coupled to said selected memory cell;

a column decoder, coupled to said address register, for receiving said address signal from said address register and for designating a column address of said selected memory cell within said memory cell array by driving said specific one of said bit lines coupled to said selected memory cell; and a read/write circuit, coupled to said column decoder array, for supplying data to be written into said memory cell array and for receiving data read out from said memory cell array, said read/write circuit including:

a write circuit, coupled to said column decoder, for controlling said column decoder, all of said word lines being driven during a first half of each write cycle, said write circuit controlling said column decoder so that none of said bit lines are driven during the first half of each write cycle and only said specific one of said bit lines coupled to said selected memory cell is driven during a second half of each write cycle.

* * * * *

UNITED STATES PATENT AND TRADEMARK OFFICE
CERTIFICATE OF CORRECTION

PATENT NO. : 4,782,466

DATED : NOVEMBER 1, 1988

INVENTOR(S) : SATORU YAMAGUCHI ET AL.

It is certified that error appears in the above-identified patent and that said Letters Patent is hereby corrected as shown below:

Col. 1, line 48, "blity" should be --bility--.

Col. 2, line 49, after "substrate," insert --and--.

Col. 9, line 13, "capcaitive" should be --capacitive--.

Signed and Sealed this

Fourteenth Day of March, 1989

Attest:

DONALD J. QUIGG

Attesting Officer

Commissioner of Patents and Trademarks